United States Patent
Protz

(10) Patent No.: US 10,631,444 B2
(45) Date of Patent: Apr. 21, 2020

(54) SUPPLY MODULE FOR SUPPLYING AN EFFECTOR SYSTEM AND EFFECTOR SYSTEM WITH A SUPPLY MODULE

(71) Applicant: MBDA Deutschland GmbH, Schrobenhausen (DE)

(72) Inventor: Rudolf Protz, Hoehenkirchen-Siegertsbrunn (DE)

(73) Assignee: MBDA Deutschland GmbH, Schrobenhausen (DE)

( * ) Notice: Subject to any disclaimer, the term of this patent is extended or adjusted under 35 U.S.C. 154(b) by 1423 days.

(21) Appl. No.: 14/277,959

(22) Filed: May 15, 2014

(65) Prior Publication Data

US 2014/0338863 A1 Nov. 20, 2014

(30) Foreign Application Priority Data

May 16, 2013 (DE) .................. 10 2013 008 407

(51) Int. Cl.
*H01M 10/052* (2010.01)
*H05K 7/20* (2006.01)
(Continued)

(52) U.S. Cl.
CPC ....... *H05K 7/2089* (2013.01); *F28D 20/0034* (2013.01); *F28D 20/02* (2013.01); *F41H 13/0043* (2013.01); *H01M 10/052* (2013.01); *H01M 10/0525* (2013.01); *H01M 10/613* (2015.04); *H01M 10/625* (2015.04); *F28D 15/00* (2013.01); *F28D 2020/0026* (2013.01); *F28D 2021/0028* (2013.01); *F28F 2280/02* (2013.01); *H01M 2220/20* (2013.01); *H01S 3/0407* (2013.01); *H01S 3/0941* (2013.01);
(Continued)

(58) Field of Classification Search
USPC ...................................... 250/492.1
See application file for complete search history.

(56) References Cited

U.S. PATENT DOCUMENTS

| 3,392,259 A | 7/1968 | Meier |
| 8,205,536 B2* | 6/2012 | Fisher ............... B64D 1/04 89/1.11 |
| 8,636,241 B2* | 1/2014 | Lugg ............... B64C 29/0025 244/12.1 |
| 9,534,537 B2* | 1/2017 | Gagne ............... F02C 6/08 |

(Continued)

FOREIGN PATENT DOCUMENTS

| DE | 60 2004 000 303 T2 | 7/2006 |
| DE | 10 2008 054 264 B4 | 9/2012 |

(Continued)

OTHER PUBLICATIONS

Singapore Office Action issued in Singaporean counterpart application No. 10201402326W dated Jun. 29, 2016 (Two (2) pages).

(Continued)

*Primary Examiner* — Phillip A Johnston
(74) *Attorney, Agent, or Firm* — Crowell & Moring LLP

(57) ABSTRACT

A supply module for supplying a weapon system includes an electric storage device and a thermal storage device that stores coolant. The supply module also includes at least one electrical connection via which power can be transferred from the electric storage device to the effector system, and at least one thermal connection via which the coolant can be transferred from the thermal storage device to the effector system.

20 Claims, 1 Drawing Sheet

Figure 1:
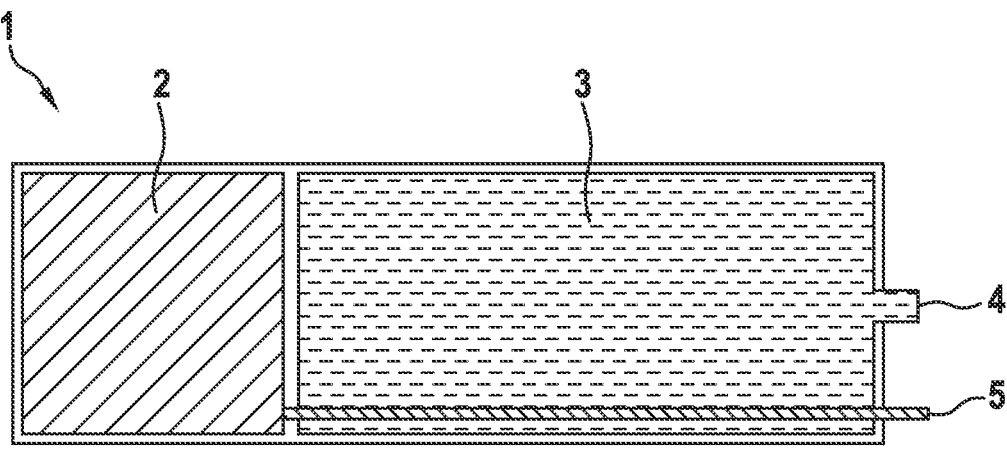

(51) Int. Cl.
- *F41H 13/00* (2006.01)
- *F28D 20/00* (2006.01)
- *H01M 10/625* (2014.01)
- *H01M 10/613* (2014.01)
- *F28D 20/02* (2006.01)
- *H01M 10/0525* (2010.01)
- *H01S 5/042* (2006.01)
- *F28D 15/00* (2006.01)
- *H01S 3/0941* (2006.01)
- *H01S 3/04* (2006.01)
- *F28D 21/00* (2006.01)

(52) U.S. Cl.
CPC .............. *H01S 5/042* (2013.01); *Y02E 60/122* (2013.01); *Y02E 60/142* (2013.01); *Y02E 60/145* (2013.01)

(56) References Cited

U.S. PATENT DOCUMENTS

| | | | | |
|---|---|---|---|---|
| 9,731,836 | B2* | 8/2017 | Gagne | B64D 27/10 |
| 10,050,312 | B2* | 8/2018 | Kuhne | H01M 10/3981 |
| 2010/0110198 | A1* | 5/2010 | Larson | B64F 1/20 |
| | | | | 348/164 |
| 2011/0113949 | A1 | 5/2011 | Bradley | |

FOREIGN PATENT DOCUMENTS

| | | |
|---|---|---|
| DE | 10 2011 116 288 A1 | 4/2013 |
| DE | 10 2012 000 672 A1 | 4/2013 |

OTHER PUBLICATIONS

German Office Action dated Oct. 28, 2013 (five (5) pages).

\* cited by examiner

SUPPLY MODULE FOR SUPPLYING AN EFFECTOR SYSTEM AND EFFECTOR SYSTEM WITH A SUPPLY MODULE

CROSS-REFERENCE TO RELATED APPLICATIONS

This application claims priority under 35 U.S.C. § 119 to German patent application number 10 2013 008 407.5, filed May 16, 2013, the entire disclosure of which is herein expressly incorporated by reference.

BACKGROUND AND SUMMARY OF THE INVENTION

Exemplary embodiments of the present invention relate a supply module for supplying a weapon system and an effector system comprising a weapon system to be supplied and the supply module. Particular preference is given to the weapon system to be supplied being a laser weapon system.

In designs for high energy laser weapon systems, diode-pumped solid state lasers in the performance category of around 100 kW are frequently proposed for generating the laser radiation. The proposed high energy laser weapon systems possess laser devices that typically have an efficiency of around 20%. During operation, a very high cooling capacity of 80% of the electrical power used is therefore required, wherein a stabilization of the coolant temperature precisely to a few degrees Celsius is necessary. In view of the aforementioned magnitude of the diode-pumped solid state lasers of a few hundred kilowatts, the cooling of laser devices poses a considerable challenge.

It is known from the prior art that laser devices can be supplied with power and cooled with a suitably dimensioned electric generator and a sufficiently large cooling unit. The required outputs, however, result in such supply devices being extremely heavy and bulky. The production of a laser weapon on a mobile carrier vehicle in particular thus becomes impossible.

Also known from the prior art is the use of electric storage batteries for supplying high energy laser weapon systems, which batteries temporarily store electrical energy for operating the weapon system. Cooling can be effected by, for example, a high volume of liquid coolant, wherein the liquid coolant heats up considerably during the operation of the weapon system. However, these designs have a major disadvantage in that, after a certain operating time of the weapon system (typically lasting about one minute), a longer period (typically around 15 minutes) is required in order to recharge the batteries and re-cool the liquid coolant. The usage time of the weapon system is thus severely limited.

German patent document DE 10 2011 116 288 A1 discloses, for example, an underwater vehicle comprising a laser effector system. Because underwater vehicles are typically already equipped with power generation and cooling systems, the laser weapon system runs off of said systems of the underwater vehicle.

German patent document DE 10 2012 000 672 A1 discloses a laser weapon system designed for stationary operation. The aim here is to store, by means of a special arrangement of energy storage units, the energy generated by a stationary generator so that this energy can be dispensed to the weapon system in concentrated form. The aim of a distributed arrangement of the energy storage units is to avoid transferring a heavy current.

German patent document DE 60 2004 000 303 T2 discloses an electro-hydraulic unit. Here an electric motor drives a pump, by means of which fluid pressure is built up in the hydraulic system. The hydraulic pressure is then stored in an accumulator, thus providing a hydraulic power reserve.

Finally. German patent document DE 10 2008 054 264 B4 discloses a multi-functional service and test mechanism for unmanned air vehicles. The service and test mechanism includes, among other things, the possibility of supplying the air vehicle with electric power fed in from outside via the power supply system of the service device.

Exemplary embodiments of the present invention are directed to a supply module for a weapon system, in particular for a high energy laser weapon system, which is easily and economically manufactured and installed, lightweight, and compact, but permits a long usage time of the weapon system. Exemplary embodiments of the present invention are also directed to an effector system that likewise satisfies the aforementioned features.

Exemplary embodiments of the present invention are directed to a supply module that can be used for supplying a weapon system, the supply module comprising an electric storage device and a thermal storage device. The electric storage device is designed for storing electrical energy over a long period. The thermal storage device is configured for storing a coolant. According to the invention, at least one electrical connection is present, via which electrical energy can be transferred from the electric storage device to the effector system. A thermal connection in turn permits the transfer of the coolant from the thermal storage device to the effector system. Such an arrangement is particularly advantageous if the weapon system is to be supplied by mobile means. High-performance supply devices are not needed in this case. According to the invention then, the supply module for supplying the weapon system is interchangeable.

The invention further relates to an effector system that comprises at least one weapon system to be supplied and at least one supply module as described previously or according to one of the developments presented further below. The weapon system to be supplied is in particular a laser weapon. The effector system further comprises at least one receiving device rigidly attached to the weapon system. The supply module can be introduced into the receiving device so that the weapon system can be supplied with electric power and with the coolant from the supply module. Hence, the receiving device is connected to the weapon system via a fluid conduit and via an electric conduit. In particular this connection can be rigidly configured, since the supply module is preferably connectable to the receiving device via the electrical connection and the thermal connection so that electric power and coolant can be drawn from the supply module. The supply module for supplying the weapon system is advantageously interchangeable so that, after an operation time in which the reserves of the supply module are expended, the weapon system is only inoperable for the time required to change the supply module. In particular the supply module is in turn reusable once its reserves have been replenished.

Preferably the electrical connection and/or the thermal connection of the supply module comprise(s) a quick coupler. The supply module can thus be quickly, easily, and securely connected to the weapon system in order to supply the weapon system with coolant and electric power. The quick couplers of the electrical connection or of the thermal connection can be brought into contact with the weapon system either jointly or independently of one another.

The electric storage device is advantageously configured in such a way that the latter has a specific power of at least 1000 Watts per kilogram (W/kg). The electric storage device in particular has a specific power of at least 3000 W/kg. Alternatively or additionally, the specific energy of the electric storage device is at least 100 Watt-hours per kilogram (Wh/kg). The specific energy is in particular at least 120 Wh/kg. With such an energy supply, in particular a maximum operating time of the weapon system with minimum weight and minimum volume is achievable.

The electric storage device can advantageously ensure a sustained supply of power to the weapon system for an operating time of at least 100 seconds. Particularly preferable is the electric storage device being able to sustain an operating time of at least 150 seconds. Hence the weapon system is available long enough to counter threats.

Preferably the electric storage device comprises lithium-iron phosphate rechargeable batteries. Such batteries have a longer useful life, a low self-discharge, and can be recharged often. Hence such batteries are very well-suited for use in weapon systems. In particular provision is made such that the lithium-iron phosphate batteries can be recharged at least 1000 times.

In an advantageous embodiment, the thermal storage device comprises a latent heat accumulator. The latter is constructed in such a way that the liquid coolant contains a material which, as heat is absorbed, undergoes a phase transition without undergoing a temperature change. Particular preference is given to such a material containing paraffin so that a cooling of the weapon system is effected by the paraffin transitioning from a solid state to a liquid state. The liquid coolant can comprise an aqueous emulsion in which are present paraffin-filled plastic capsules. The plastic capsules are in particular 5 μm in diameter. Such a liquid coolant is very advantageous for cooling laser systems because this fluid always maintains its temperature, while the cooling is effected by the phase transition of the paraffin.

In a particularly advantageous manner the coolant has a latent heat capacity of at least 20 kilojoules per kilogram (kJ/kg). In particular the coolant has a latent heat capacity of at least 40 kJ/kg. A phase transition temperature is in particular defined at 20° C. Such values enable an advantageous cooling of laser weapon systems in such a way that the generated heat is effectively dissipated.

Preference is given to the effector system of the invention being configured in such a way that a loading device is present. The loading device can preferably be a crane. The supply module can be introduced into the receiving device and/or removed from the receiving device by means of the loading device. Due to the advantageous loading device, the supply module is quickly and easily interchangeable so that only a short idle time is necessary, during which the weapon system to be supplied is inoperable.

In another preferred embodiment of the effector system of the invention, at least two receiving devices are present so that it is possible to switch between the receiving devices for supplying the weapon system. In this manner the weapon system can be operated continuously, since it is possible to switch from a first supply module to a second supply module when the first supply module is expended. Because the supplying of the weapon system is ensured by the second supply module, the first supply module can then be removed from the receiving device. A third supply module can be introduced into the receiving device of the first supply module so that, after the second supply module is expended, it is possible to switch to the third supply module. It is obvious that a continuous operation of the weapon system is enabled in this manner.

Finally, the effector system comprises a platform, on which the weapon system as well as the at least one receiving device is mounted. The platform is advantageously configured as a mobile platform, in particular as a land vehicle or as a watercraft. This has the advantage that the weapon system can always be moved to a place where it is needed.

BRIEF DESCRIPTION OF THE DRAWING FIGURES

Figure 2:
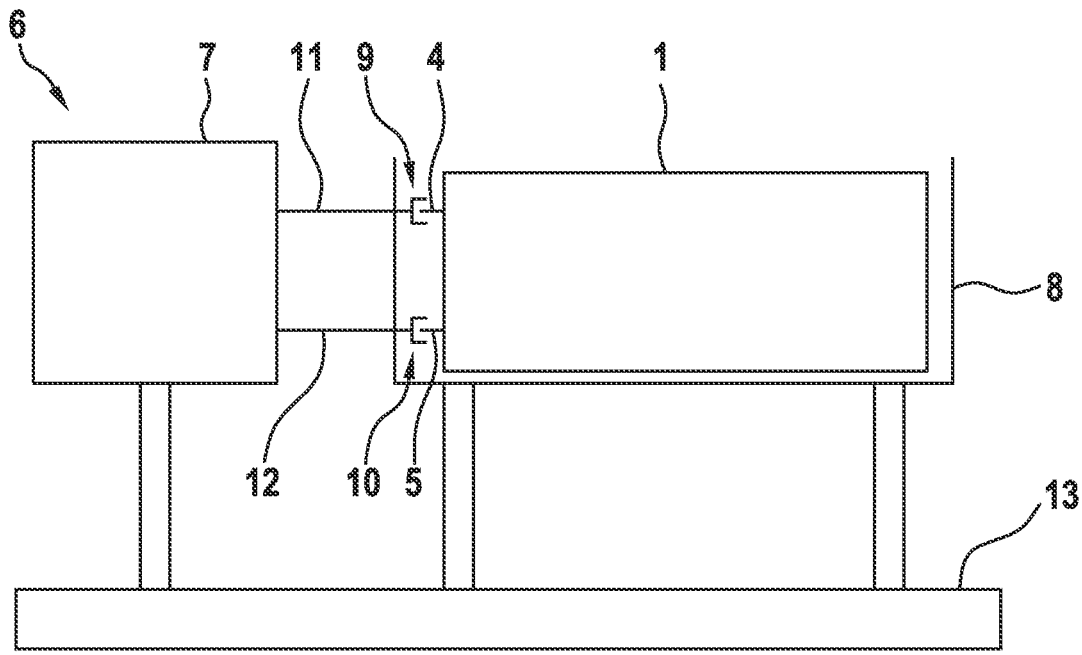

The invention will now be described in detail with the aid of exemplary embodiments, which refer to the appended drawings. Shown are:

FIG. 1 a schematic view of the supply module according to an exemplary embodiment of the invention, and FIG. 2 a schematic view of the effector system according to an exemplary embodiment of the invention.

DETAILED DESCRIPTION

FIG. 1 shows a supply module 1 according to an exemplary embodiment of the invention. The supply module 1 comprises an electric storage device 2 and also a thermal storage device 3. The electric storage device 2 is connected to an electrical connection 5, which is designed as a quick coupler. The energy of the electric storage device can be dispensed via the electrical connection 5. Also present is a thermal connection 4, which is likewise designed as a quick coupler. A coolant stored in the thermal storage device 3 can be dispensed via the thermal connection 4.

Preference is given to the module consisting of a cylindrical steel or aluminum container 0.5 m in diameter and 1.5 m in length. In this container is housed the electric storage device 2 in the form of electric storage batteries, whereas the thermal storage device 3 comprises a liquid coolant, which in turn comprises a latent heat accumulating material.

Preferably the electrical energy is stored by means of lithium-iron phosphate rechargeable batteries, which have a specific power of 3000 W/kg and a specific energy of 120 Wh/kg. With the electric storage device 2, 50 kW of power can be dispensed for 140 seconds, the electric storage device having a weight of only 16.7 kg and a volume of 50 l.

The thermal storage device 3 comprises a coolant, which comprises an aqueous emulsion of paraffin-filled plastic capsules. Preferably, the plastic capsules have a dimension of ca. 5 μm. This emulsion possesses a latent heat capacity of 40 kJ/kg at a predefined phase transition temperature. This phase transition temperature is 20° C. During a cooling process by the aqueous emulsion, this temperature remains constant because the absorbed heat effects a phase transition of the paraffin from solid to liquid. The thermal storage device has in particular a weight of 100 kg and a volume of 100 l. 4 MJ of cooling energy can thus be provided.

According to the exemplary embodiment, the total weight of the supply module is about 170 kg. The supply module 1 is thus very easy to manipulate. The supply module can in particular be introduced into a receiving device 8, as shown in FIG. 2.

FIG. 2 shows an effector system 6, which comprises a weapon system 7 to be supplied. The weapon system 7 is a high energy laser weapon system. The weapon system 7 is connected to the receiving device 8 by means of a fluid conduit 11 and by means of an electric conduit 12. The previously described supply module 1 can be introduced into the receiving device 8. The receiving device 8 also makes it possible to connect the electrical connection 5 to the electric conduit 12 via an electric coupling element 10, and thus to supply the weapon system 7 with electrical energy. The receiving device 8 furthermore makes it possible to connect the thermal connection 4 of the supply module 1 to the thermal conduit 11 via a thermal coupling element 9, and thus to supply the weapon system 7 with the coolant.

For supplying the weapon system 7, an electric control unit is arranged within the weapon system 7, which controls the supplying of the weapon system 7 with power from the electric storage device 2. Also present is a cooling pump, which draws the coolant from the thermal storage device 3 and feeds the coolant back into the thermal storage device 3. Between withdrawal and in-feeding of the coolant, the coolant is used to absorb and discharge the waste heat of the weapon system 7.

The weapon system 7 has an output of 50 kW, wherein an optical power output of 10 kW can be generated. The weapon system thus has an efficiency of 20%. The supply module 1 according to the aforementioned exemplary embodiment thus makes it possible to supply the weapon system 7 for an operating time of at least 100 seconds.

As soon as the supply module 1 is expended, the latter can be removed from the receiving device 8 so that another supply module 1 can be inserted therein. In this manner the weapon system 7 is operational again within a very short time span such that the effector system 6 is characterized by a high rate of availability. The spent supply module 1 can then be prepared for re-use by a recycling device, wherein the electric storage device is recharged and the coolant of the thermal storage device is restored to a ready-to-cool state by another phase transition.

The effector system 6 advantageously has at least two receiving devices 8. Thus, it is possible to remove a supply module 1 from one of the receiving devices 8 while another supply module 1 in the other receiving device 8 is supplying the weapon system 7. This means that replacement of the supply modules 1 is possible while the weapon system 7 is in operation. The weapon system 7 can therefore be operated in a continuous mode, which is not possible or only possible with considerable effort in prior art systems. Lastly, the effector system 6 is affixed to a platform 13. This means that both the weapon system 7 and the receiving device 8 are mounted on the platform 13. Preferably the platform 13 is a mobile platform, in particular as a land vehicle or as a watercraft. Because the effector unit 6 is rapidly and easily moved to a location where it is needed, the platform 13 enables a highly varied and diverse use of the weapon system 7.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LIST OF REFERENCE SIGNS

1 Supply module
2 Electric storage device
3 Thermal storage device
4 Thermal connection
5 Electrical connection
6 Effector system
7 Weapon system
8 Receiving device
9 Thermal coupler
10 Electric coupler
11 Thermal conduit
12 Electric conduit
13 Platform

What is claimed is:

1. A supply module for supplying a weapon system, comprising:
    an electric storage device within a housing that is receivable by a receiving device coupled to the weapon system, wherein the electric storage device stores electric energy that powers the weapon system, and wherein the weapon system is not powered by an electric generator;
    a thermal storage tank within the housing, wherein the thermal storage tank stores a coolant;
    at least one electrical connection between the electric storage device and the weapon system, wherein the at least one electrical connection is configured to transfer the electric energy from the electric storage device to the weapon system, and wherein the at least one electrical connection is established via at least one electric coupling element; and
    at least one thermal connection between the thermal storage tank and the weapon system, wherein the at least one thermal connection is established via at least one thermal coupling element, and wherein the at least one thermal connection is configured to transfer coolant from the thermal storage tank to the weapon system,
    wherein the supply module is interchangeable, and
    wherein the at least one electric coupling element and the at least one thermal coupling element are provided by a receiving device of the weapon system, which is configured to receive the interchangeable supply module via the housing.

2. The supply module of claim 1, wherein the electrical connection or the thermal connection comprises a quick coupler.

3. The supply module of claim 1, wherein the electric storage device has a specific power of at least 1000 W/kg.

4. The supply module of claim 1, wherein the electric storage device has a specific power of at least 3000 W/kg.

5. The supply module of claim 1, wherein the electric storage device has a specific energy of at least 100 Wh/kg.

6. The supply module of claim 1, wherein the electric storage device has a specific energy of at least 120 Wh/kg.

7. The supply module of claim 1, wherein the electric storage device is configured to ensure a sustained supply of power to the weapon system for an operating time of at least 100 seconds.

8. The supply module of claim 1, wherein the electric storage device is configured to ensure a sustained supply of power to the weapon system for an operating time of at least 150 seconds.

9. The supply module of claim 1, wherein the electric storage device comprises lithium-iron phosphate rechargeable batteries.

10. The supply module of claim 1, wherein the thermal storage tank comprises a latent heat accumulator.

11. The supply module of claim 10, wherein the coolant has a latent heat capacity of at least 20 kJ/kg.

12. The supply module of claim 10, wherein the coolant has a latent heat capacity of at least 40 kJ/kg.

13. A system, comprising:

a laser weapon system;

at least one interchangeable supply module, which comprises:

an electric storage device within a housing that is receivable by at least one receiving device, wherein the electric storage device stores electric energy that powers the weapon system, and wherein the weapon system is not powered by an electric generator;

a thermal storage tank within the housing, wherein the thermal storage tank stores a coolant;

at least one electrical connection between the electric storage device and the weapon system, wherein the at least one electrical connection is configured to transfer the electric energy from the electric storage device to the laser weapon system;

at least one thermal connection between the thermal storage tank and the weapon system, wherein the at least one thermal connection is configured to transfer coolant from the thermal storage tank to the laser weapon system; and the at least one receiving device, which is rigidly connected to the weapon system, wherein the receiving device is provided with at least one electric coupling element to establish the at least one electrical connection and with at least one thermal coupling element to establish the at least one thermal connection, and wherein the at least one interchangeable supply module is configured so that it can be introduced into the at least one receiving device in order to supply the weapon system with electric power and with coolant from the supply module.

14. The system of claim 13, further comprising:

a crane, wherein the at least one interchangeable supply module is configured so that it can be introduced into the receiving device or removed from the at least one receiving device by the crane.

15. The system of claim 13, wherein the system comprises a second receiving device, wherein the system is configured so that the laser weapon system can be switchable supplied by the at least one and second receiving devices, which allows the laser weapon system to be operated continuously.

16. The system of claim 13, further comprising:

a platform, wherein the platform is a mobile platform and the laser weapon system and the at least one receiving device are mounted on the platform.

17. The supply module of claim 1, wherein the housing has an interior volume of approximately 0.29 cubic meters.

18. The supply module of claim 1, wherein the weight of the supply module is approximately 170 kilograms.

19. The system of claim 13, wherein the housing has an interior volume of approximately 0.29 cubic meters.

20. The system of claim 13, wherein the weight of the supply module is approximately 170 kilograms.

\* \* \* \* \*